Figure 1:
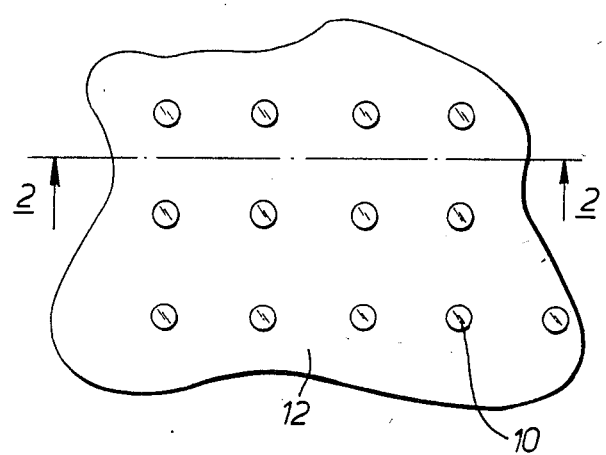

United States Patent [19]

Davies et al.

[11] Patent Number: 4,595,603

[45] Date of Patent: Jun. 17, 1986

[54] METHOD OF MAKING DIAMOND HEATSINK ASSEMBLIES

[75] Inventors: Ian Davies; Anthony M. Howard, both of Towcester, United Kingdom

[73] Assignee: Plessey Overseas Limited, Ilford, England

[21] Appl. No.: 664,386

[22] Filed: Oct. 24, 1984

[30] Foreign Application Priority Data

Oct. 25, 1983 [GB] United Kingdom ............... 8328474

[51] Int. Cl.$^4$ .............................................. B05D 5/12
[52] U.S. Cl. ...................................... 427/82; 427/214
[58] Field of Search .................................. 427/214, 82

[56] References Cited

U.S. PATENT DOCUMENTS

| 3,678,995 | 7/1972 | Collard | 165/185 |
| 3,945,902 | 3/1976 | Hawrylo et al. | 204/192 |
| 4,425,195 | 1/1984 | Papanicolaou | 204/3 |

OTHER PUBLICATIONS

Chemical Abstracts, 77(22): 145,430q (1972).
Chemical Abstracts, 78(10): 64,001u (1973).
Chemical Abstracts, 84(10): 68,563a (1976).
Chemical Abstracts, 85(10): 67,064x (1976).
Chemical Abstracts 88(20): 138,432r (1978).
Chemical Abstracts 96(20): 172,886s (1982).

*Primary Examiner*—Thurman K. Page
*Attorney, Agent, or Firm*—Fleit, Jacobson, Cohn & Price

[57] ABSTRACT

A method of making a diamond heatsink includes securing a number of spaced diamonds to a sacrificial plate and then metallizing them with, for example, a thin layer of gold, silver, copper or aluminium. The plate and the diamonds are subsequently metal plated with a similar metal to the metallization until the diamonds are completely covered. The sacrificial plate is removed and the exposed surface cleaned and polished. Finally the assembly is diced to produce a number of individual heatsink assemblies.

4 Claims, 4 Drawing Figures

METHOD OF MAKING DIAMOND HEATSINK ASSEMBLIES

This invention relates to a method of making diamond heatsink assemblies which are particularly suitable for mounting small electronic devices thereon which emit a fair degree of heat when in operation.

Diamond heatsinks suffer from the disadvantage of high cost and thus any technique which achieves a reduction in unit cost is of considerable value.

It is an object of the present invention therefore to provide a diamond heatsink assembly having a reduced unit cost by employing a mass production method of making the assemblies.

According to the present invention a method of making a diamond heatsink assembly comprises the steps of securing a plurality of diamonds to a sacrificial plate, metallising the exposed portions of the diamonds with a relatively thin layer of metal, metal plating the sacrificial plate and the exposed portions of the diamonds with a relatively thick layer of metal, removing the sacrificial plate and dividing the metal plating into a plurality of parts, each part including at least one diamond to produce a plurality of individual diamond heatsink assemblies.

The sacrificial plate may be made of any type of relatively cheap metal.

The relatively thin layer of metallisation for the exposed portions of the diamonds must have good electrical and heat conductivity and may comprise gold, silver, copper, aluminium or chromium.

The relatively thick layer of metal plating is also preferably platinum, gold, silver, copper or aluminium.

Figure 2:
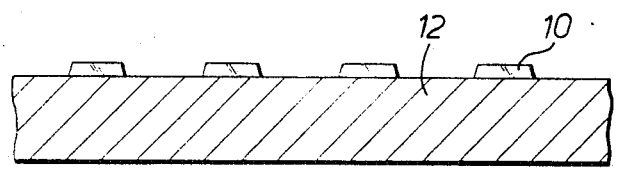
Figure 3:
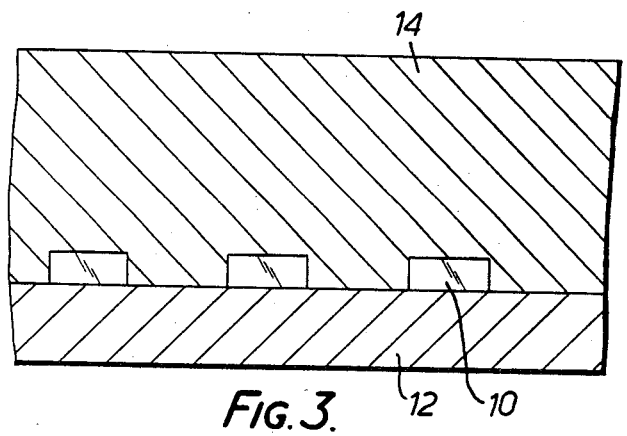
Figure 4:
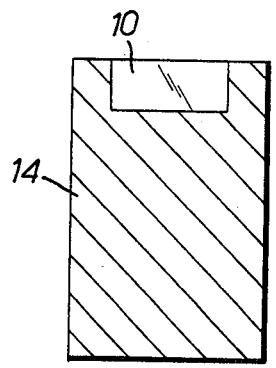

An embodiment of the invention will now be described by way of example only with reference to the accompanying drawings in which:

FIG. 1 is a plan view of a sacrificial plate having matrix of diamonds mounted thereon, FIG. 2 is a cross-sectional view of FIG. 1 taken along the line 2—2, FIG. 3 is a cross-sectional view of the sacrificial plate which has been metallised and metal plated and, FIG. 4 is a cross-sectional view of an individual heatsink assembly produced in accordance with the invention.

Type IIA diamonds 10 are fixed in a matrix formation to a sacrificial plate 12 as shown in FIGS. 1 and 2 and subsequently metallised with, for example, a thin layer of chromium.

The matrix assembly then has a metal plating 14 applied to produce the multi-package array shown in FIG. 3, with a good electrical and heat-conductive metal such as platinum with a finishing plating of gold of Å thickness.

Thereafter the sacrificial plate 12 is removed and the exposed surface polished and cleaned. Finally the structure is diced to produce individual diamond heatsink packages (see FIG. 4) which may be further cleaned prior to metallisation of the exposed diamond top surface, and component bonding.

Whilst FIG. 4 shows a finished diamond heatsink assembly with one diamond, assemblies with two or more diamonds can easily be made by suitable dicing of the metal plating 14.

We claim:

1. A method of making a diamond heatsink assembly, said method comprising the steps of:

securing a plurality of diamonds to a sacrificial plate, metallising the exposed portions of the diamonds with a relatively thin layer of metal, each diamond remaining substantially unmetallised where the diamond abuts the sacrificial plate, plating the sacrificial plate and the exposed portions of the diamond with a relatively thick layer of metal, removing the sacrificial plate to expose only a portion of each diamond, and dividing the layer of metal substantially enclosing the plurality of diamonds and said relatively thin layer of metal plating into a plurality of parts, each part including at least one diamond to produce a plurality of individual diamond heatsink assemblies.

2. A method as claimed in claim 1 in which the sacrificial plate comprises any relatively cheap metal.

3. A method as claimed in claim 1 in which the relatively thin layer of metallisation on the exposed portions of the diamonds comprises a metal selected from the group comprising gold, silver, copper, aluminium and chromium.

4. A method as claimed in claim 1 in which the relatively thick layer of metal plating comprises a metal selected from the group comprising platinum, gold, silver, copper and aluminium.

* * * * *